(12) United States Patent
Malinovitch

(10) Patent No.: US 6,864,600 B2
(45) Date of Patent: Mar. 8, 2005

(54) APPARATUS AND METHOD FOR PROVIDING MULTIPLE POWER SUPPLY VOLTAGES TO AN INTEGRATED CIRCUIT

(75) Inventor: Aviv Malinovitch, Hod Hasharon (IL)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/780,100

(22) Filed: Feb. 9, 2001

(65) Prior Publication Data

US 2002/0109413 A1 Aug. 15, 2002

(51) Int. Cl.[7] .................................................. H02J 1/00
(52) U.S. Cl. ........................ 307/70; 307/87; 307/116; 307/125; 307/130
(58) Field of Search .......................... 307/87, 134, 139, 307/70, 116, 125, 130; 713/330

(56) References Cited

U.S. PATENT DOCUMENTS 5,848,281 A * 12/1998 Smalley et al. ........ 395/750.04
6,195,755 B1 * 2/2001 Webster et al. ............. 713/330
6,529,032 B1 * 3/2003 Cruickshank et al. ......... 326/14

* cited by examiner

Primary Examiner—Robert DeBeradinis

(57) ABSTRACT

There is disclosed an apparatus and method for providing multiple power supply voltages to an integrated circuit. In an integrated circuit of the type comprising at least two power supply domains in which each power supply domain comprises at least one module powered by the same voltage level, the apparatus and method of the present invention blocks an output signal in a first power supply domain from being sent to a second power supply domain when the second power supply domain is in a low power mode. The apparatus and method of the present invention also blocks an output signal from a first power supply domain from being received in a second power supply domain when the first power supply domain is in a low power mode. Power sense cells are used to determine the status of power supply domains and logic circuits are used to block undesired signals. The present invention also properly synchronizes clock signals when power supply domains are activated or inactivated.

24 Claims, 2 Drawing Sheets

APPARATUS AND METHOD FOR PROVIDING MULTIPLE POWER SUPPLY VOLTAGES TO AN INTEGRATED CIRCUIT

TECHNICAL FIELD OF THE INVENTION

The present invention is generally directed to providing electrical power to electronic circuits and, more specifically, to an apparatus and method for providing multiple power supply voltages to integrated circuits.

BACKGROUND OF THE INVENTION

An integrated circuit (IC) is a semiconductor wafer on which thousands or millions of tiny resistors, capacitors, and transistors are fabricated. An integrated circuit is also known as a "microchip" or a "chip." Integrated circuit technology enables different electronic modules to be combined into a single integrated circuit. The term "module" refers to a unit within a larger device that is designed to be separately installed, replaced, or serviced. A great deal of effort has been invested in the development of chips in which an entire electronic system is integrated with both hardware and software on a single chip.

Such an implementation is known as a "System-On-a-Chip" or an "SOC". In a System-on-a-Chip implementation Intellectual Property (IP) elements and/or Virtual Components (VC) are mixed and matched on a single integrated circuit chip. An IP element may be any custom hardware development. IP elements are usually reused for different operations and tasks. Virtual Components (VC) are software implementations that handle the IP elements and manage operations of the chip.

System-On-a-Chip designs are based on the reuse of IP elements. An illustrative example of an SOC design is an information appliance called Geode™ SC1400. Geode™ SC1400 is a trademark of National Semiconductor Corporation. Geode™ SC1440 comprises a single integrated circuit chip in which several data acquisition and processing units are embedded. Additional information on Geode™ SC1400 may be obtained at the following website address: "http://www.national.com/appinfo/solutions/0,2062,243,00.html."

The Geode™ SC1400 comprises an x86-compatible processor, an MPEG2 decoder, a cathode ray tube (CRT) interface, a television (TV) video processor, a bridge, and super input/output (I/O) block, all of which require a plurality of conventionally designed chip devices. Each of the components of the Geode™ SC1400 is implemented from one or more independent modules, where each module has data input/output (I/O) and a connection to a power supply. It is not necessary to understand the design or operation of the Geode™ SC1400 in order to be able to understand the principles of the present invention. The Geode™ SC1400 is described in this patent document only as an illustrative example of a System-On-a-Chip.

In System-On-a-Chip implementations like the Geode™ SC1400 described above, different modules on the chip may be analog and/or digital, according to their designed function. For example, the bridge and the processors are digital modules, while the super input/output (I/O) module is an analog module. The super input/output (I/O) module comprises analog elements because it processes analog signals.

In a System-On-a-Chip implementation different modules use different voltage levels. For example, the Geode™ SC1400 utilizes six (6) different power supply voltages. The need for so many power supply voltages is due to the different voltage levels required by the modules, and the requirements for noise immunity and for low power mode operations.

The design of a System-On-a-Chip raises new types of problems, such as interactions between the different modules, power management, and noise disturbances arising from the close proximity of analog modules and digital modules on a single integrated circuit chip. These types of problems were formerly addressed at the system level. That is, these types of problems were addressed in the circuit board design stage. However, in System-On-a-Chip systems, these types of problems have to be addressed during the design stage of the System-On-a-Chip.

One such problem is the presence of multiple power supply voltages. In an IP design only one power supply voltage ($V_{DD}$) is usually involved. In a mixed signal design (i.e., analog and digital) two power supply voltages ($V_{ANALOG}$ and $V_{DIGITAL}$) are usually involved. However, the design of a System-On-a-Chip can involve a plurality of power supply voltages. For example, the Geode™ SC1400 has six power supply voltages. They are $V_{DIGITAL}$, $V_{SB}$, $V_{BAT}$, $V_{CORE}$, $V_{IO}$ and $V_{ANALOG}$.

Another problem relates to the use of a low power mode to reduce power consumption. For most of the digital modules and analog modules on a System-On-a-Chip, there are times when an individual digital module or an individual analog module is not actively operating. In particular, there are periods of time during which the modules do not contain valid data. The data that was generated or processed by the modules has been passed on to a subsequent stage and will not be required again from the modules. During such periods of time, a module may enter a low power mode in order to reduce power consumption. While a module is in a low power mode, activity of the module is either partially halted or entirely halted. The module enters a full power mode only when full operation of the module is required.

A low power mode is typically achieved in a module by cutting off the module's power supply, and (if required) by maintaining some logic activated by a low frequency clock to monitor the ongoing activities of the module. The power cutoff for a module is easily accomplished in an IP design where only one power supply voltage is involved. The power cutoff for a module is also easily accomplished in a mixed signal design where only two power supply voltages are involved.

In a System-On-a-Chip design, however, a plurality of power supply voltages are involved. Because usually more than two power supply voltages are involved, the designer of a System-On-a-Chip must confront a diversity of miscellaneous problems that are caused by the presence of several power supply voltages. One of the main problems involves preventing and eliminating incorrect transactions between active modules and inactive modules.

Some of the other problems that must be addressed are due to noise interference and clock synchronization that occur when inactive modules are activated from their low power mode.

There is therefore a need in the art for an apparatus and method that will provide multiple power supply voltages to an integrated circuit. There is also a need in the art for an apparatus and method that will prevent and eliminate incorrect transactions between active modules and inactive modules. There is also a need in the art for an apparatus and method that will properly synchronize clock signals when a module is changed from an active full power mode to an inactive low power mode. There is also a need in the art for an apparatus and method that will properly synchronize clock signals when a module is changed from an inactive low power mode to an active full power mode.

SUMMARY OF THE INVENTION

To address the above-discussed deficiencies of the prior art, it is a primary object of the present invention to provide an apparatus and method that will provide multiple power supply voltages to an integrated circuit.

A "power supply domain" is a module or a group of modules on an integrated circuit chip that are powered by the same power supply voltage. The present invention is designed for use in an integrated circuit of the type comprising at least two power supply domains. The apparatus of the present invention blocks an output signal in a first power supply domain from being sent to a second power supply domain when the second power supply domain is in a low power mode. Similarly, the apparatus of the present invention blocks an output signal from a first power supply domain from being received in a second power supply domain when said first power supply domain is in a low power mode.

It is an object of the present invention to provide an apparatus and method to prevent and eliminate erroneous signals between power supply domains in an integrated circuit.

It is a further object of the present invention to provide an apparatus and method to block signals sent to and from power supply domains that are in a low power mode.

It is also an object of the present invention to provide an apparatus and method to eliminate "Back Drive" effects between two or more power supply domains in an integrated circuit.

It is an additional object of the present invention to provide an apparatus and method to properly synchronize block signals when power supply domains are activated or inactivated.

It is yet an additional object of the present invention to provide an apparatus and method to determine if a power supply domain is in an active status or in an inactive status.

It is another object of the present invention to provide and apparatus and method that will simplify the design of integrated circuit systems.

Other objects and advantages of the present invention will become apparent as the invention is described in detail.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
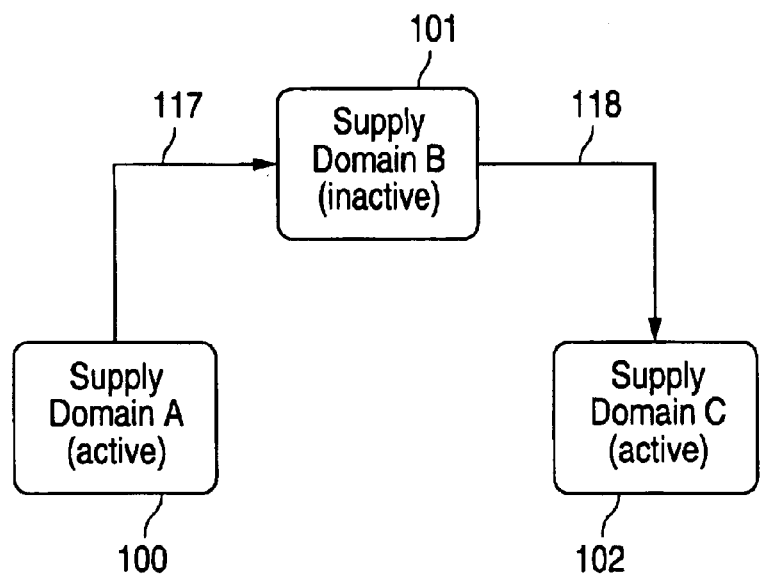
FIG. 1 illustrates an exemplary set of power supply domains comprising one inactive power supply domain connected between two active power supply domains.

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged system comprising multiple power supply voltages.

The design of a System-On-a-Chip presents a designer with radically different types of problems to solve. Some of the problems that were formerly addressed at the system level (in the circuit board design stage) must now be addressed in the design of the integrated circuit chip. As previously mentioned, a major problem is the presence of multiple power supply voltages. The design of a System-On-a-Chip usually involves a plurality of power supply voltages.

For example, the Geode™ SC1400 has six power supply voltages. They are $V_{DIGITAL}$, $V_{SB}$, $V_{BAT}$, $V_{CORE}$, $V_{IO}$ and $V_{ANALOG}$. Each of these six power supply voltages is dedicated to a particular functionality of one or more of the modules of the Geode™ chip. The $V_{SB}$ is a power supply voltage that is used for parts of the Geode™ chip that are active in the stand-by mode. The $V_{AB}$ is a power supply voltage that is used as a power supply voltage for parts of the Geode™ chip that are active only when the battery supply source is active. That is, only when the Geode™ chip is disconnected from its main power supply source.

The $V_{CORE}$ is a power supply voltage that is used for the central processing unit's (CPU's) module. The $V_{IO}$ is a power supply voltage that is used to power the input/output (I/O) modules. The $V_{ANALOG}$ is a power supply voltage that is used to power the analog parts of the Geode™ chip. The $V_{DIGITAL}$ is a power supply voltage that is used to power all the digital parts of the Geode™ chip that are not active in the stand-by mode, or are not active when the system is disconnected from its main power supply source, and are not core or I/O modules.

The presence of multiple power supply voltages in an integrated circuit chip requires a special design to insure that the chip operates properly, especially when some of the power supply sources are not active. As will be more fully described, the present invention provides an apparatus and method for providing multiple power supply voltages to an integrated circuit so that the presence of the multiple power supply voltages does not interfere with the proper operation of the integrated circuit.

A "power supply domain" is a module or a group of modules on an integrated circuit chip that have the same power supply voltage. A power supply domain may also be referred to as a "Supply Domain." The words "Supply Domain" are abbreviated with the letters "SD." A "Supply Domain interface" comprises (1) all the signals that are input signals to a Supply Domain, and (2) all the signals that are output signals from a Supply Domain. In some cases, specific signals (e.g., data bus signals) are defined as bi-directional signals. A bi-directional signal may be an output signal in one scenario (e.g. a "read" transaction) or an input signal in another scenario (e.g., a "write" transaction).

FIG. 1 illustrates an exemplary set of Supply Domains (100, 101, 102) comprising an inactive Supply Domain 101 connected between active Supply Domain 100 and active Supply Domain 102. When in the active state, the modules in Supply Domain 100 are capable of sending data to the modules in Supply Domain 101 on signal line 117. Data in the modules in Supply Domain 101 can also be sent to the modules in Supply Domain 102 on signal line 118.

In FIG. 1, Supply Domain 101 is in an inactive state (i.e., in a low power mode) and Supply Domain 100 and Supply Domain 102 are in an active state (i.e., in a full power mode). The arrangement of the Supply Domains illustrated in FIG. 1 is vulnerable to a problem that is referred to as a "Back Drive" problem. A "Back Drive" problem exists when a data signal that is correctly sent from an active Supply Domain is incorrectly received by an inactive Supply Domain. More particularly, the data that is correctly sent on an output of the active Supply Domain is incorrectly received by the inactive Supply Domain. "Back Drive" effects occur when data signals that are sent from the active Supply Domain cause a change in the electrical state of the inactive Supply Domain.

The situation is made worse when such changes are reflected on the output of the inactive Supply Domain. The consequences of the output signals of the inactive Supply Domain are mostly undesirable and the outcome generally unpredictable.

For example, assume that no protective measures are taken to prevent "Back Drive" problems in the Supply Domains shown in FIG. 1. The data signals on signal line 117 are received by the modules in inactive Supply Domain 101. These data signals may cause Supply Domain 101 to send out erroneous electrical signals on signal line 118. The erroneous electrical signals on signal line 118 may be received and processed by Supply Domain 102 as if the signals were correct signals. The outcome of Supply Domain 102 processing such erroneous signals is unpredictable.

For an additional example, consider a case in which one or more Supply Domains contains analog modules. In such a case the electrical activity of the analog modules usually introduces noise interference on the input/output (I/O) line of one or more of the Supply Domains. Assume that Supply Domain 101 contains one or more analog modules. Then noise signals from the analog modules may appear on output signal line 118. Although Supply Domain 101 is in an inactive state, the noise signals on signal line 118 may be received and incorrectly interpreted by Supply Domain 102 as if the signals were correct signals. In such a case, Supply Domain 102 has no knowledge regarding the actual state of Supply Domain 101.

The present invention provides an apparatus and method to efficiently eliminate "Back Drive" effects. The present invention is capable of efficiently determining which signals on an input line to a Supply Domain are "legal" signals (i.e., correct signals) and which signals are "illegal" signals (i.e., erroneous signals). The present invention is also capable of preventing the sending of unnecessary signals between active Supply Domains and inactive Supply Domains.

To prevent errors that occur when inactive Supply Domains erroneously send signals to and from active Supply Domains, it is necessary to block all signals to and from inactive Supply Domains. For example, in FIG. 1, legal signals on signal line 117 from active Supply Domain 100 must be blocked in order to prevent them from entering the input of inactive Supply Domain 101. In the same manner, illegal signals (e.g., noise signals) that may appear on signal line 118 must be blocked to prevent them from entering the input of active Supply Domain 102.

Figure 2:
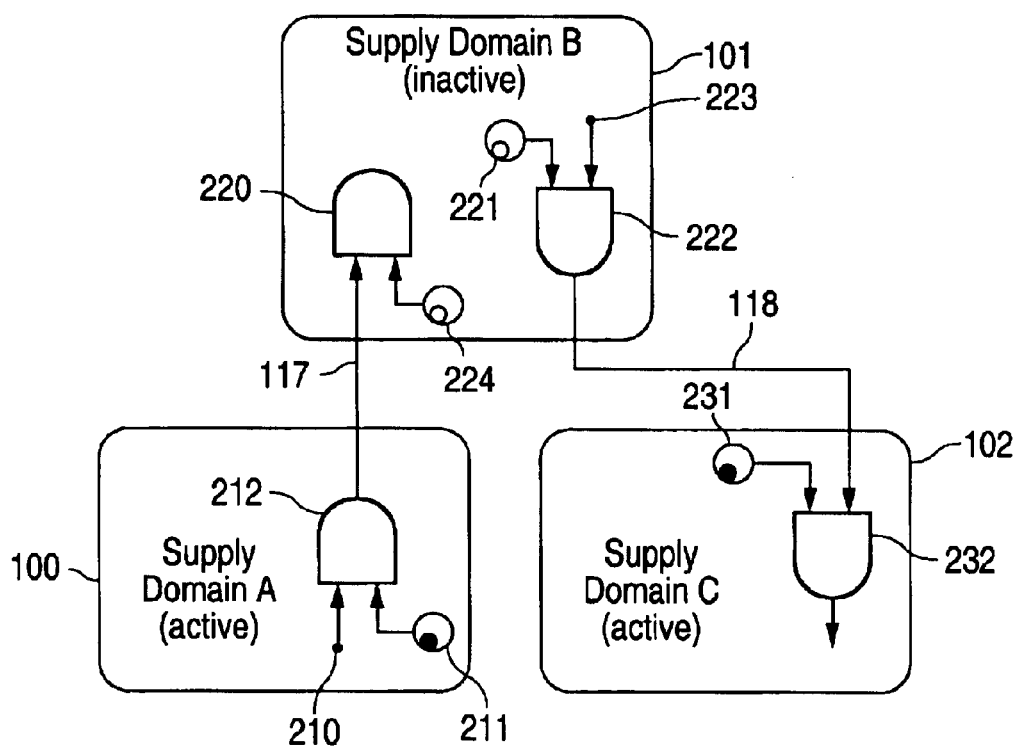
FIG. 2 illustrates an advantageous embodiment of the present invention located within the exemplary set of power supply domains shown in FIG. 1.

FIG. 2 illustrates an advantageous embodiment of the present invention located within the exemplary set of power supply domains shown in FIG. 1. The apparatus shown in FIG. 2 is capable of blocking illegal signals that appear between active Supply Domain 100 and inactive Supply Domain 101. The apparatus shown in FIG. 2 is also capable of blocking illegal signals that appear between inactive Supply Domain 101 and active Supply Domain 102.

Logic circuits are provided for blocking illegal signals that may appear on the signal lines between the Supply Domains. The logic circuits are implemented in the form of AND gate 212 in Supply Domain 100, AND gate 220 and AND gate 222 in Supply Domain 101, and AND gate 232 in Supply Domain 102. As is well known, an AND gate is a logical circuit which outputs a High signal if all of its input signals are also High signals.

Supply Domain 100 is provided with a Power Sense Cell (PSC) 211 coupled to an input of AND gate 212. Power Sense Cell 211 generates a signal that indicates to AND gate 212 whether the full power supply voltage in Supply Domain 100 is present.

Similarly, Supply Domain 101 is provided with a Power Sense Cell 224 coupled to an input of AND gate 220 and with a Power Sense Cell 221 coupled to an input of AND gate 222. Power Sense Cell 224 generates a signal that indicates to AND gate 220 whether the full power supply voltage in Supply Domain 101 is present. Power Sense Cell 221 generates a signal that indicates to AND gate 222 whether the full power supply voltage in Supply Domain 101 is present.

Lastly, Supply Domain 102 is provided with a Power Sense Cell 231 coupled to an input of AND gate 232. Power Sense Cell 231 generates a signal that indicates to AND gate 232 whether the full power supply voltage in Supply Domain 102 is present.

The AND gates shown in FIG. 2 are integrated within each of their respective Supply Domains. Although the Power Sense Cells shown in FIG. 2 are shown as integrated within each of their respective Supply Domains, the Power Sense Cells may alternatively be implemented as outside elements, not within any Supply Domain.

The input/output (I/O) signals to and from each Supply Domain are enabled or disabled depending upon the state of the Supply Domain that is the source (or destination) of the signal that is being sent. For example, the signals on signal line 117 are accepted or rejected at the input of Supply Domain 101 by the operation of AND gate 220. If Supply Domain 101 is inactive (i.e., in a low power mode), then Power Sense Cell 224 will send a zero ("0") signal to an input of AND gate 220. Then the signal on signal line 117 will not be accepted. If Supply Domain 101 is active (i.e., in a full power mode), then Power Sense Cell 224 will send a one ("1") signal to an input of AND gate 220. Then the signal on signal line 117 will be accepted.

Similarly, the signals on signal line 118 are accepted or rejected at the input of Supply Domain 102 by the operation of AND gate 232. If Supply Domain 102 is inactive (i.e., in a low power mode), then Power Sense Cell 231 will send a zero ("0") signal to an input of AND gate 232. Then the signal on signal line 118 will not be accepted. If Supply Domain 102 is active (i.e., in a full power mode), then Power Sense Cell 231 will send a one ("1") signal to an input of AND gate 232. Then the signal on signal line 118 will be accepted.

An output signal from signal line 210 in Supply Domain 100 will be accepted on signal line 117 by the operation of AND gate 212. If Supply Domain 101 (the destination Supply Domain) is inactive (i.e., in a low power mode), then Power Sense Cell 211 will send a zero ("0") signal to an input of AND gate 212. Then the output signal on signal line 210 will not be sent to signal line 117. If Supply Domain 101 is active (i.e., in a full power mode), then Power Sense Cell 211 will send a one ("1") signal to an input of AND gate 212. Then the output signal on signal line 210 will be sent to signal line 117.

Similarly, an output signal on signal line 223 in Supply Domain 101 will be accepted on signal line 118 by the operation of AND gate 222. If Supply Domain 102 (the destination Supply Domain) is inactive (i.e., in a low power mode), then Power Sense Cell 221 will send a zero ("0") signal to an input of AND gate 222. Then the output signal on signal line 223 will not be sent to signal line 118. If Supply Domain 102 is active (i.e., in a full power mode), then Power Sense Cell 221 will send a one ("1") signal to an input of AND gate 222. Then the output signal on signal line 223 in Supply Domain 101 will be sent to signal line 118.

The AND gates in the Supply Domains act as switching devices. The inputs of the Power Sense Cells are used to determine the switch state of the AND gates. A one ("1") signal from a Power Sense Cell will turn "on" an AND gate. In the "on" condition, the AND gate will pass on the signal received on the other input of the AND gate.

Signals on signal line 117 are sent to an input of AND gate 220 in Supply Domain 101. When Supply Domain 101 is active, AND gate 220 accepts or rejects the signals on signal line 117 depending upon whether Supply Domain 100 is active or inactive. Power Sense Cell 224 sends a signal to the remaining input of AND gate 220 that indicates whether Supply Domain 100 is active or inactive. When Supply Domain 100 is active, Supply Domain 101 accepts the signals on signal line 117. When Supply Domain 100 is inactive, Supply Domain 101 rejects the signals on signal line 117.

When Supply Domain 101 is inactive (as shown in FIG. 2), AND gate 220 is not functioning because its power supply is in an OFF condition. This also causes the signals on signal line 117 to be rejected. It should also be noted that the inactive condition of Supply Domain 101 causes Power Sense Cell 211 to disable the output signal on signal line 210 by putting AND gate 212 in an OFF condition. This ensures that no signal is sent over signal line 117. Not only is the output signal on signal line 210 disabled, but noise signals on signal line 117 are also depressed, providing additional noise immunity.

Similarly, signals on signal line 118 are sent to an input of AND gate 232 in Supply Domain 102. When Supply Domain 102 is active (as shown in FIG. 2), AND gate 232 accepts or rejects the signals on signal line 118 depending upon whether Supply Domain 101 is active or inactive. Power Sense Cell 231 sends a signal to the remaining input of AND gate 232 that indicates whether Supply Domain 101 is active or inactive. When Supply Domain 101 is active, Supply Domain 102 accepts the signals on signal line 118. When Supply Domain 101 is inactive, Supply Domain 102 rejects the signals on signal line 118.

When Supply Domain 102 is inactive, AND gate 232 is not functioning because its power supply is in an OFF condition. This also causes the signals on signal line 118 to be rejected. It should also be noted that the inactive condition of Supply Domain 101 causes Power Sense Cell 221 to disable the output signal on signal line 223 by putting AND gate 222 in an OFF condition. This ensures that no signal is sent over signal line 118. Not only is the output signal on signal line 223 disabled, but noise signals on signal line 118 are also depressed, providing additional noise immunity.

It should be noted that without the presence of the logic circuits of the present invention, there would be various types of "Back Drive" signals and noise signals on signal line 117 and on signal line 118.

In a proper design according to the method of the present invention, each module should have only one power supply source. In addition, each Supply Domain interface signal must be active and must be defined as an "Input" signal or an "Output" signal. The Supply Domain interface signal can not be defined as both an "Input" signal and an "Output" signal. The Supply Domain interface signal also can not be defined as a "Tri-State" signal. A "Tri-State" signal is an electronic signal that may have any of three output states, either a High state, a Low state, or a High Impedance state. A "Tri-State" signal may not be used in the present invention because a "Tri-State" signal can not be blocked.

Figure 3:
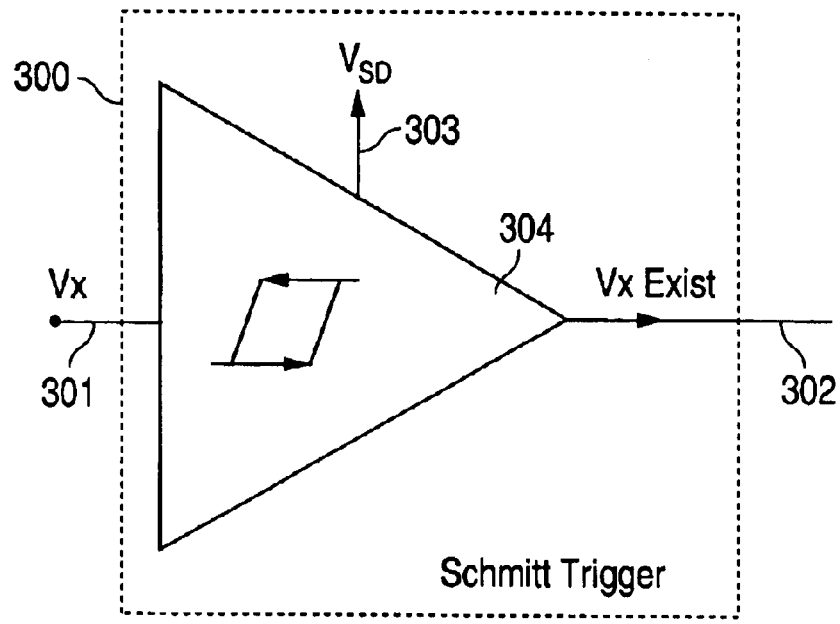
FIG. 3 illustrates an exemplary embodiment of a power sense cell for use with the apparatus and method of the present invention.

FIG. 3 illustrates an exemplary embodiment of a power sense cell 300 for use with the apparatus and method of the present invention. Power sense cells 211, 221, 224, and 231 may each comprise a power sense cell of the type illustrated by power sense cell 300. Power sense cell technology is well known. Various implementations of power sense cells may be adequate for use in the present invention. Power sense cell 300 comprises a Schmitt trigger circuit 304. Schmitt trigger circuit 304 is a bistable circuit in which a transition from the output state from a High level to a Low level occurs at a lower output voltage than the input voltage required for a transition of the output state from a Low level to a High level. This feature is indicated by the hysteresis loop shown on the Schmitt trigger symbol in FIG. 3.

This particular feature is required mostly in implementation arrangements where power sense cell 300 is integrated into a Supply Domain. For example, assume that power sense cell 300 represents power sense cell 224 in Supply Domain 101. The power supply voltage for power sense cell 300 is $V_{SD}$ 303. In this example, $V_{SD}$ 303 is the power supply voltage for Supply Domain 101. The input signal voltage $V_X$ on input signal line 301 represents the supply voltage of Supply Domain 101. The output signal voltage "$V_X$ Exist" on output signal line 302 indicates whether Supply Domain 101 is in low power mode or is in full power mode. If the "$V_X$ Exist" signal on output signal line 302 is at the Low level, then Supply Domain 101 is in low power mode. If the "$V_X$ Exist" signal on output signal line 302 is at the High level, then Supply Domain 101 is in full power mode.

Special attention is required to design the proper transition voltages of the Schmitt trigger circuit 304. The output signal "$V_X$ Exist" should be switched to the High level only when full power has been restored and Supply Domain 101 is fully functional. On the other hand, the output signal "$V_X$ Exist" should be switched to the Low level when the voltage supply $V_X$ of Supply Domain 101 is falling and the outputs of Supply Domain 101 are still valid. This may be accomplished by selecting the proper transition voltages in Schmitt trigger circuit 304.

Another problem faced by integrated circuit designers is the synchronization of blocked clock signals. More particularly, when a clock signal is blocked by a signal from a power sense cell signal that switches the output of an AND gate, the clock signal will typically appear in the form of a "glitch," when the Supply Domain voltage is turned "on" or "off." This is due to the fact that the power sense cell output and the clock signals are not synchronized. As a consequence, when a clock signal is blocked (or unblocked) the first clock signal to appear is usually shortened.

Figure 4:
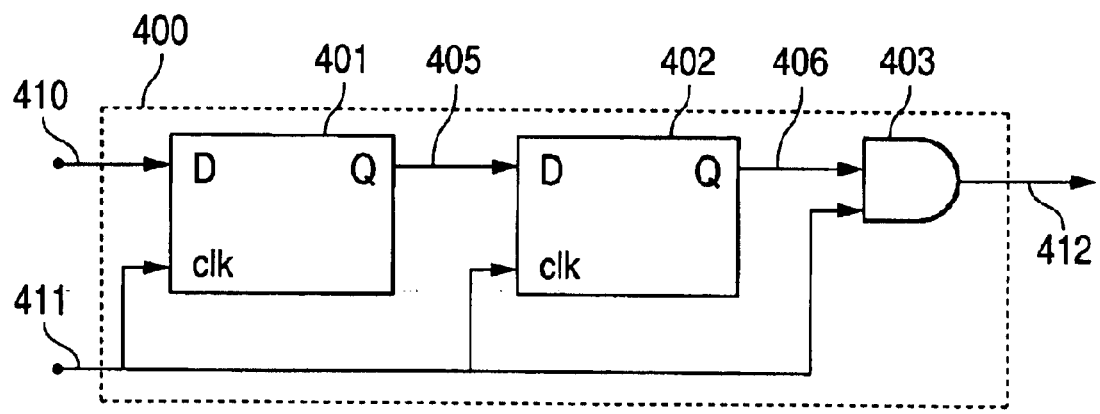
FIG. 4 illustrates an advantageous embodiment of a circuit of the present invention for synchronizing blocked clock signals.

FIG. 4 illustrates an advantageous embodiment of a blocking circuit 400 of the present invention for synchronizing blocked clock signals to prevent clock signals from being shortened. Blocking circuit 400 comprises a first D flip flop circuit 401, a second D flip flop circuit 402, and a logical AND gate 403. A "D flip flop" circuit is an edge-triggered circuit element having two stable states. The input signal to a D flip flop circuit appears at the output of the D flip flop circuit delayed by one clock cycle. The letter "D" refers to the delay of the signal. The expression "D flip flop" refers to a "delayed" flip flop circuit. For convenience, a D flip flop circuit may be referred to using the abbreviation "DFF."

The input signal of a DFF is labeled with the letter "D" and the output signal of a DFF is labeled with the letter "Q." The output signal Q of a DFF changes to the state of the input signal D of the DFF when a clock signal is received at the clock input ("clk") of the DFF.

In the preferred embodiment shown in FIG. 4, a power sense cell signal is provided on input signal line 410 to first DFF 401 in order to block a clock signal on clock input signal line 411. If a power sense cell signal changes from "off" to "on" during a clock cycle, the output of first DFF 401 on signal line 405 will reflect the change in the power sense cell signal only on the next clock pulse. One additional clock pulse will be required for the change in the power sense cell signal to pass through second DFF 402 and reach input line 406 of AND gate 403. In this manner, at least two (2) clock cycles will be required from the time that the power sense cell signal changes until AND gate 403 releases the blocking of the clock signal on output signal line 412.

Blocking circuit 400 guarantees that a Supply Domain containing a power sense cell (e.g., Supply Domain 101 containing power sense cell 224) has fully recovered from its inactive, low power mode and is fully powered for operation before any signals are sent to it. Blocking circuit 400 eliminates the possibility that signals will be fed to a Supply Domain while the Supply Domain is powering up.

Similarly, blocking circuit 400 eliminates the possibility that signals will be fed to a Supply Domain while the Supply Domain is powering down. If a power sense cell signal changes from "on" to "off" during a clock cycle, the output of first DFF 401 on signal line 405 will reflect the change in the power sense cell signal only on the next clock pulse. One additional clock pulse will be required for the change in the power sense cell signal to pass through second DFF 402 and reach input line 406 of AND gate 403. In this manner, at least two (2) clock cycles will be required from the time that the power sense cell signal changes until AND gate 403 releases the blocking of the clock signal on output signal line 412. In this manner, blocking circuit 400 guarantees that a Supply Domain containing a power sense cell receives no signals while it is making its transition to its inactive, low power mode.

It is clear that the apparatus and method of the present invention is applicable in general to any implementation that comprises a plurality of distinct operating modules that require multiple power supply voltages. Although the present invention has been described in detail for the case of a "System-on-a-Chip," it is clear that the apparatus and method of the present invention is applicable to any type of integrated circuit implementation.

The examples and descriptions set forth above have been provided only for the purpose of illustration, and are not intended to limit the present invention in any way. As will be understood by a person who is skilled in the art, the present invention can be carried out in a great variety of ways, employing more than one technique, without exceeding the scope of the invention. As will also be understood by a person who is skilled in the art, various changes, substitutions and alterations to the disclosed advantageous embodiment of the present invention may be made without departing from the spirit and scope of the present invention in its broadest form.

What is claimed is:

1. For use in an integrated circuit of the type comprising at least two power supply domains in which each power supply domain comprises at least one module powered by the same voltage level, an apparatus for blocking an output signal in a first power supply domain from being sent to a second power supply domain when said second power supply domain is in a low power mode.

2. The apparatus as claimed in claim 1 wherein said apparatus comprises:

a power sense cell within said integrated circuit, said power sense cell capable of determining whether said second power supply domain is in a low power mode, and a logic circuit capable of blocking said output signal in said first power supply domain from being sent to said second power supply domain when said power sense cell determines that said second power supply domain is in a low power mode.

3. The apparatus as claimed in claim 2 wherein said logic circuit comprises an AND gate having as a first input said output signal of said first power supply domain, and having as a second input a signal from said power sense cell.

4. The apparatus as claimed in claim 2 wherein said power sense cell is located within said first power supply domain.

5. The apparatus as claimed in claim 2 wherein said power sense cell comprises a Schmitt trigger circuit.

6. The apparatus as claimed in claim 2 further comprising an apparatus for synchronizing blocked clock signals to prevent clock signals from being shortened by a signal from said power sense cell.

7. The apparatus as claimed in claim 6 wherein said apparatus comprises:

a first D flip flop circuit having as one input a signal from said power sense cell, and having as a second input a clock signal;

a second D flip flop circuit having as one input an output signal from said first D flip flop circuit, and having as a second input said clock signal; and an AND gate having as one input an output signal from said second D flip flop circuit, and having as a second input said clock signal.

8. For use in an integrated circuit of the type comprising at least two power supply domains in which each power supply domain comprises at least one module powered by the same voltage level, an apparatus for blocking an output signal in a first power supply domain from being received in a second power supply domain when said first power supply domain is in a low power mode.

9. The apparatus as claimed in claim 8 wherein said apparatus comprises:

a power sense cell within said integrated circuit, said power sense cell capable of determining whether said first power supply domain is in a low power mode, and a logic circuit capable of blocking said output signal from said first power supply domain from being received in said second power supply domain when said power sense cell determines that said first power supply domain is in a low power mode.

10. The apparatus as claimed in claim 9 wherein said logic circuit comprises an AND gate having as a first input said output signal from said first power supply domain, and having as a second input a signal from said power sense cell.

11. The apparatus as claimed in claim 9 wherein said power sense cell is located within said second power supply domain.

12. The apparatus as claimed in claim 9 wherein said power sense cell comprises a Schmitt trigger circuit.

13. The apparatus as claimed in claim 9 further comprising an apparatus for synchronizing blocked clock signals to prevent clock signals from being shortened by a signal from said power sense cell.

14. The apparatus as claimed in claim 13 wherein said apparatus comprises:

a first D flip flop circuit having as one input a signal from said power sense cell, and having as a second input a clock signal;

a second D flip flop circuit having as one input an output signal from said first D flip flop circuit, and having as a second input said clock signal; and an AND gate having as one input an output signal from said second D flip flop circuit, and having as a second input said clock signal.

15. For use in an integrated circuit of the type comprising at least two power supply domains in which each power supply domain comprises at least one module powered by the same voltage level, a method for blocking an output signal in a first power supply domain from being sent to a second power supply domain when said second power supply domain is in a low power mode, said method comprising the steps of:

sensing with a power sense cell when said second power supply domain is in a low power mode; and blocking said output signal in said first power supply domain from being sent to said second power supply domain when said power sense cell determines that said second power supply domain is in a low power mode.

16. The method as claimed in claim 15 wherein the step of blocking said output signal in said first power supply domain from being sent to said second power supply domain comprises the steps of:

sending said output signal in said first power supply domain to a first input of an AND gate; and sending a signal from said power sense cell to a second input of said AND gate.

17. The method as claimed in claim 15 wherein said power sense cell is located in within said first power supply domain.

18. The method as claimed in claim 15 wherein said power sense cell comprises a Schmitt trigger circuit.

19. The method as claimed in claim 15 further comprising the step of:

synchronizing blocked clock signals to prevent clock signals from being shortened by a signal from said power sense cell.

20. For use in an integrated circuit of the type comprising at least two power supply domains in which each power supply domain comprises at least one module powered by the same voltage level, a method for blocking an output signal in a first power supply domain from being received in a second power supply domain when said first power supply domain is in a low power mode, said method comprising the steps of:

sensing with a power sense cell when said first power supply domain is in a low power mode; and blocking said output signal in said first power supply domain from being received in said second power supply domain when said power sense cell determines that said first power supply domain is in a low power mode.

21. The method as claimed in claim 20 wherein the step of blocking said output signal in said first power supply domain from being received in said second power supply domain comprises the steps of:

sending said output signal from said first power supply domain to a first input of an AND gate; and sending a signal from said power sense cell to a second input of said AND gate.

22. The method as claimed in claim 20 wherein said power sense cell is located in within said second power supply domain.

23. The method as claimed in claim 20 wherein said power sense cell comprises a Schmitt trigger circuit.

24. The method as claimed in claim 20 further comprising the step of:

synchronizing blocked clock signals to prevent clock signals from being shortened by a signal from said power sense cell.

* * * * *